US006812620B2

(12) United States Patent
Scheeper et al.

(10) Patent No.: US 6,812,620 B2
(45) Date of Patent: Nov. 2, 2004

(54) MICROMACHINED CAPACITIVE ELECTRICAL COMPONENT

(75) Inventors: Patrick Richard Scheeper, Naerum (DK); Torben Storgaard-Larsen, Humlebaek (DK)

(73) Assignee: Bruel & Kjaer Sound & Vibration Measurement A/S, Naerum (DK)

( * ) Notice: Subject to any disclaimer, the term of this patent is extended or adjusted under 35 U.S.C. 154(b) by 1 day.

(21) Appl. No.: 10/195,462

(22) Filed: Jul. 16, 2002

(65) Prior Publication Data

US 2003/0034536 A1 Feb. 20, 2003

Related U.S. Application Data

(63) Continuation-in-part of application No. PCT/DK00/00732, filed on Dec. 22, 2000.

(51) Int. Cl.[7] .................................................. H01L 41/08

(52) U.S. Cl. ........................ 310/324; 381/150; 381/174

(58) Field of Search ................................ 310/309, 324, 310/328

(56) References Cited

U.S. PATENT DOCUMENTS

| | | | | |
|---|---|---|---|---|
| 3,707,131 A | * 12/1972 | Massa | 310/324 |
| 3,716,681 A | * 2/1973 | Barrow | 310/324 |
| 3,752,941 A | * 8/1973 | Massa et al. | 310/324 |
| 3,937,991 A | * 2/1976 | Massa et al. | 310/324 |
| 4,292,561 A | * 9/1981 | Martin | 310/322 |
| 4,597,099 A | * 6/1986 | Sawafuji | 381/190 |

(List continued on next page.)

FOREIGN PATENT DOCUMENTS

WO WO 00/70630 11/2000

OTHER PUBLICATIONS

J. Bergqvist et al., "A silicon condenser microphone using bond etch–back technology," Sensors and Actuators A 45:115–124, 1994.

J. Bergqvist et al., "A new condenser microphone in silicon," Sensors and Actuators A21–A23:123–125, 1990.

T. Hourouina et al., "A new condenser microphone with a $p^+$ silicon membrane," Sensors and Actuators A31:149–152, 1992.

S. Bouwstra, "Silicon–rich nitride films for micromechanical devices," Ph.D. Thesis 52–56, 1990, ISBN 90–900 3328–9.

D. Hohm et al., "A subminiature condenser microphone with silicon nitride membrane and silicon back plate," J. Acoust. Soc. Am 85(1):476–480, 1989.

(List continued on next page.)

*Primary Examiner*—Thomas M. Dougherty
(74) *Attorney, Agent, or Firm*—Oliff & Berridge, PLC

(57) ABSTRACT

A micromachined capacitive electrical component such as a condenser microphone with a support structure and a rigid plate with an electrically conductive plate electrode secured to the support structure at discrete locations. A diaphragm of a substantially non-conductive material is secured to the support structure along its periphery at a predetermined distance from the substantially rigid plate, whereby the substantially rigid plate and the diaphragm define an air gap. The diaphragm is movable in response to sound pressure and carries an electrically conductive diaphragm electrode. The support structure and the diaphragm electrode are electrically interconnected so as to have substantially the same electrical potential. A layer of a substantially non-conductive material is disposed between the substantially rigid plate and the support structure at least at the discrete locations. Such a transducer is suitable for use in existing scientific and industrial sound measurement equipment using high polarization voltages, eg 200 V.

12 Claims, 2 Drawing Sheets

U.S. PATENT DOCUMENTS

| | | | | | |
|---|---|---|---|---|---|
| 5,452,268 | A | | 9/1995 | Bernstein | 367/181 |
| 5,554,851 | A | * | 9/1996 | Hirai et al. | 250/442.11 |
| 5,573,679 | A | | 11/1996 | Mitchell et al. | 216/2 |
| 5,854,846 | A | | 12/1998 | Beavers | 381/174 |
| 5,856,620 | A | * | 1/1999 | Okada | 73/514.32 |
| 6,087,760 | A | * | 7/2000 | Yamaguchi et al. | 310/334 |
| 6,104,127 | A | * | 8/2000 | Kameyama et al. | 310/346 |
| 6,178,249 | B1 | * | 1/2001 | Hietanen et al. | 381/174 |
| 6,472,797 | B1 | * | 10/2002 | Kishimoto | 310/324 |
| 6,472,798 | B2 | * | 10/2002 | Kishimoto | 310/344 |
| 6,655,011 | B1 | * | 12/2003 | Kornrumpf et al. | 29/622 |
| 2002/0057484 | A1 | * | 5/2002 | Mori | 359/291 |

OTHER PUBLICATIONS

P. Horwath et al., "Miniature condenser microphone with a thin silicon membrane fabricated on simox substrate," Transducers '95—Eurosensors IX, 696–699, 1995.

A.E. Kabir et al., "High sensitivity acoustic transducers with thin p + membranes and gold back–plate," Sensors and Actuators 78:138–142, 1999.

M. Pedersen et al., "A silicon condenser microphone with *polyimide diaphragm* and backplate," Sensors and Actuators A 63:97–104, 1997.

P.R. Scheeper et al., "A silicon condenser microphone with a *silicon nitride diaphragm* and backplate," J. Micromech. Microeng. 2:187–189, 1992.

A.J. Sprenkels et al., "Development of an electret microphone in silicon," Sensors and Actuators 17:509–512, 1989.

A. Torkkeli et al., "Capacitive microphone with low–stress polysilicon membrane and high–stress polysilicon backplate," Sensors and Actuators 85:116–123, 2000.

S. M. Sze. "Physics of semiconductor devices". $2^{nd}$ edition. John Wiley & Sons. New York. 1981. pp. 402–404.

PhD. thesis, "Resonating microbridge mass flow sensor". S. Bouwstra, University of Twente, The Netherlands. Mar. 1990. pp. 52–56.

* cited by examiner

MICROMACHINED CAPACITIVE ELECTRICAL COMPONENT

This is a Continuation-in-Part of International Application No. PCT/DK00/00732 filed Dec. 22, 2000. The entire disclosure of the prior application is hereby incorporated by reference herein in its entirety.

This invention relates to a micromachined capacitive electrical component in general. In particular the invention relates to a capacitive transducer such as a condenser microphone. Such micromachined systems are often referred to as Micro Electro-Mechanical Systems (MEMS). The invention is particularly useful in a condenser microphone that can be used eg with standard sound measurement equipment using a high polarization voltage.

BACKGROUND OF THE INVENTION

In principle, a condenser microphone comprises a thin diaphragm that is mounted in close proximity to a back plate. The thin diaphragm is constrained at its edges, so that it is able to deflect when sound pressure is acting on it. Together the diaphragm and back plate form an electric capacitor, where the capacitance changes when sound pressure deflects the diaphragm. In use, the capacitor will be charged using a DC voltage, usually called polarization voltage. When the capacitance varies due to a varying sound pressure, an AC voltage that is proportional to the sound pressure will be superimposed on the DC voltage. The AC voltage is used as output signal of the microphone.

The polarization voltage $V_{pol}$ is applied by an external voltage source via a resistor (see FIG. 1). The resistance of this resistor must be so high that it ensures an essentially constant charge on the microphone, even when the capacitance changes due to sound pressure acting on the diaphragm. The value of this bias resistor is typically 15 GΩ. A high polarization voltage is used in standard scientific and industrial sound measurement equipment—more than 100 V, and usually 200 V. Using a high polarization voltage dates back to measurement equipment based on vacuum tubes and technological limitations in fabrication of condenser microphones using precision mechanics. Although a lower polarization voltage would be more compatible with electronics of today, using a high polarization voltage has become a standard in sound measurement equipment during the years. Therefore, microphones intended for sound measurement should preferably be designed for use with a polarization voltage up to at least 200 V in order to be compatible with existing measuring equipment.

Micromachined components that are usually developed for use in low-voltage systems—typically <10 V. In condenser microphone chips, between the diaphragm electrode and the back plate electrode there is an air gap. The typical thickness of the air gap of known micromachined microphone chips is less than 5 μm, whereas a typical microphone for scientific and industrial precision sound measurement has a 20 μm air gap. The difference in air gap thickness is necessitated by the difference in operating voltage. Micromachined microphone chips need a small air gap to obtain a field strength in the air gap that is high enough to get an acceptable sensitivity for a low polarization voltage. However, the electrical field strength cannot be increased without limit. Due to the polarization voltage electrostatic forces attract the diaphragm to the back plate, and above a critical electrical field strength the diaphragm "collapses" and snaps to the back plate. The collapse voltage $V_c$ is given by the formula $$V_c = \sqrt{\frac{1.578 \cdot \sigma \cdot t \cdot D^3}{\varepsilon_0 \cdot R^2}}$$

where σ is the diaphragm stress, t is the diaphragm thickness, D is the air gap thickness, $\epsilon_0$ is the vacuum permittivity, and R is the diaphragm radius. It can be seen from the formula that for a constant collapse voltage, a reduction of the air gap thickness must be compensated by an increase of the diaphragm stiffness ($\sigma \cdot t/R^2$). Consequently, a typical micromachined microphone with an air gap of less than 10 μm needs a diaphragm with a very high stiffness in order to operate at 200 V. For example, a microphone with a diaphragm radius of 0.5 mm and an air gap of 10 μm needs a stiffness of 87.5 N/m, which can be obtained by a 0.5 μm thick diaphragm with a stress of 175 MPa. This is certainly not impossible to manufacture, but the problem is that the high diaphragm stiffness also gives a microphone with a very low sensitivity and consequently a very high noise level. In this example, a noise level of more than 45 dB can be expected, which is too high for most sound measurement applications. In other words, a microphone that should be able to operate using 200 V polarization voltage and at the same time have a low noise level must be provided with an air gap with a thickness of more than 10 μm.

Using an air gap thickness of much more than 20 μm is not recommended either, since then the capacitance of the microphone thereby becomes so small that it becomes difficult to measure the microphone signal, due to the signal attenuation caused by parasitic capacitances in parallel with the microphone.

Another issue concerning the use of 200 V polarization voltage is electrical insulation between the diaphragm electrode and the back plate electrode. To ensure an extremely stable sensitivity, it is critical that the leakage resistance of a sound measurement microphone is high—at least 1000 times the value of the bias resistor. This corresponds to 15 TΩ, which value must be maintained even under extreme conditions, such as 200 V polarization voltage in combination with high humidity and temperature.

The known principle of the construction of a microphone chip with an electrically conducting diaphragm is shown in FIG. 2. At the edges of the chip, a conducting diaphragm 1 and back plate 3 provided with holes 5 are attached to a silicon frame 2. At this connection, insulator 4 separates the back plate electrode and the diaphragm electrode. Due to the nature of thin-film deposition processes, the thickness of the insulator 4 is limited to values of the order of 1–3 μm. The leakage resistance of the microphone chip is determined by the quality of the insulator 4.

Silicon microphone chips can also be made using insulating diaphragm materials. Such known constructions are shown in FIG. 3 and FIG. 4. The diaphragm of the microphone chip in FIG. 3 is provided with a diaphragm electrode 6. In this case, the insulating diaphragm acts as insulator between the diaphragm electrode and the back plate electrode. It is also possible to provide the insulating diaphragm with an electrode 7 on the side facing the air gap. This design is shown in FIG. 4. A conductive layer on the outside of the diaphragm and chip is still needed to provide effective shielding against electromagnetic interference (EMI).

The leakage resistance of insulating materials in FIGS. 2–4 comprises two components, the bulk resistance and the surface resistance. The surface resistance is determined by the insulator material, by the condition of the surface (cleanliness, humidity, surface treatment and finish) and by the lateral dimensions of the insulator (path length that the leakage current has to travel between the diaphragm electrode and the back plate electrode). The bulk resistance is determined by the insulator material, the thickness of the insulator, and by the electrical field strength in the insulator. At higher field strengths, an insulating material shows a leakage current density J increasing exponentially with the square root of the field strength E, which is typical for the Poole-Frenkel conduction mechanism in insulators (see for information in S. M. Sze, "Physics of semiconductor devices", $2^{nd}$ ed., John Wiley & Sons, New York, 1981, pp. 402–404). The exponential increase in leakage current gives an exponentially decreasing leakage resistance of the microphone. The exact value of the leakage resistance at these high field strengths depends on the material and the thickness (field strength!). When testing the bulk insulating properties of silicon nitride films, we have measured a leakage resistance of more than 10 TΩ at 100 V/μm across the silicon nitride, whereas the resistance decreased to 1 GΩ at 400 V/μm.

In our opinion, the microphone chip designs based on an insulating diaphragm material are to be preferred from a fabrication point-of-view. There are several conducting diaphragm materials that can be made on silicon wafers. In the table below, we show a list of materials, together with the disadvantages.

| | |
|---|---|
| Evaporated or sputtered metal | Lack of stress control<br>Need for complicated layer protection during silicon etching |
| $p^{++}$ silicon (boron etch-stop) | Lack of stress control |
| $p^{+}$ silicon (pn etch-stop) | Lack of stress control<br>Complicated etching process |
| Polycrystalline silicon | Need for complicated layer protection during silicon etching |

With most of the conductive diaphragm materials, the stress cannot be controlled, whereas stress is an extremely important parameter for controlling microphone parameters such as sensitivity and resonance frequency. The stress of polycrystalline silicon can be controlled with sufficient accuracy, but the fabrication of microphone diaphragms is complicated, since the thin diaphragms have to be protected during the etching of the silicon wafer.

A very attractive insulating diaphragm material is silicon nitride. The stress of the silicon nitride layers can be accurately controlled, and the fabrication of diaphragms is easy, since silicon nitride is hardly attacked by the silicon etchant. Therefore, we consider silicon nitride to be a better diaphragm material than the available conducting materials.

A problem with the known chip designs in FIG. 3 and FIG. 4 is that the bulk properties of silicon nitride are not good enough at the extremely high electrical field strength when using the microphone chip at 200 V polarization voltage. We have for example measured a leakage resistance of 1 GΩ at 400 V/μm (200V across a 0.5 μm silicon nitride diaphragm). Increasing the diaphragm thickness is not a solution to this problem, since the diaphragm stiffness then also increases. This increase in stiffness can be compensated by a decrease in diaphragm stress, which is done in practice by changing the composition of the silicon nitride to a more silicon-rich composition. A problem is that the insulating properties of silicon nitride degrade rapidly when shifting to more silicon-rich compositions, so that the advantage of using a higher thickness is gone. Information about this can be found in the Ph.D. thesis "Resonating microbridge mass flow sensor", by S. Bouwstra, University of Twente, The Netherlands, March 1990, pp. 52–56. Another way to get around this stiffness problem is to thin down the diaphragm after silicon nitride deposition. This is a critical process that is difficult to do at wafer level in production.

Much of what is stated above in relation to condenser microphones also applies to capacitive electrical components in general and to MEMS components in particular.

SUMMARY OF THE INVENTION

A much more simple method is proposed here for improving the leakage resistance of microphone chips, by adding an extra insulator to the design, which ensures that the electrical field strength in the insulator always stays below values where the bulk leakage resistance becomes too low, say <50 V/μm.

Thus a new design is proposed for a micromachined capacitive electrical component such as a condenser microphone, having the following characteristics:

1. A non-conductive diaphragm, preferably from silicon nitride,
2. A high bulk leakage resistance between the diaphragm electrode and the back plate electrode, obtained by adding an extra insulator,
3. A high surface leakage resistance between the diaphragm electrode and the back plate electrode, obtained by designing a large lateral distance between the diaphragm electrode and the back plate electrode, and
4. An air gap thickness larger than 10 μm, securing that a low-stiffness diaphragm can be used in combination with a polarization voltage up to 200 V.

Figure 1:
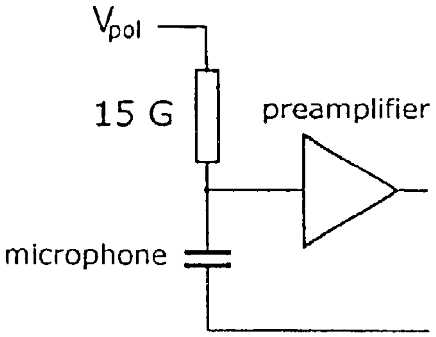
FIG. 1 PRIOR ART
FIG. 1 illustrates a circuit including a microphone.
Figure 2:
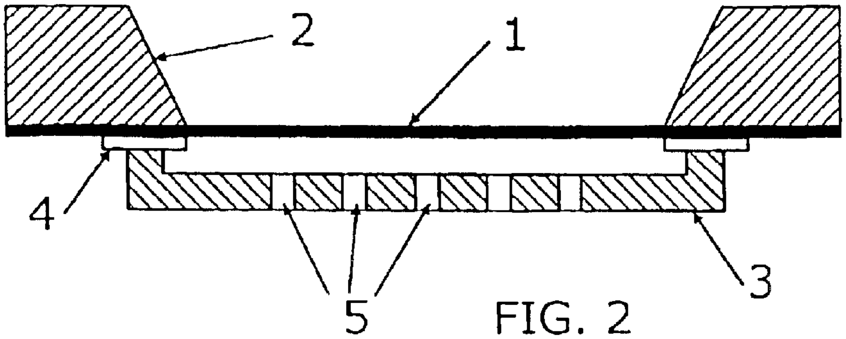
FIG. 2 PRIOR ART
FIG. 2 illustrates a microphone chip.
Figure 3:
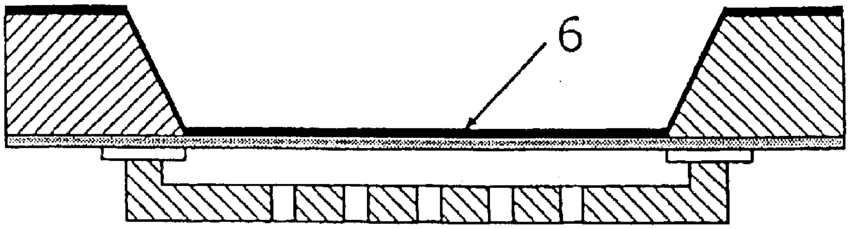
FIG. 3 PRIOR ART
FIG. 3 illustrates another microphone chip.
Figure 4:
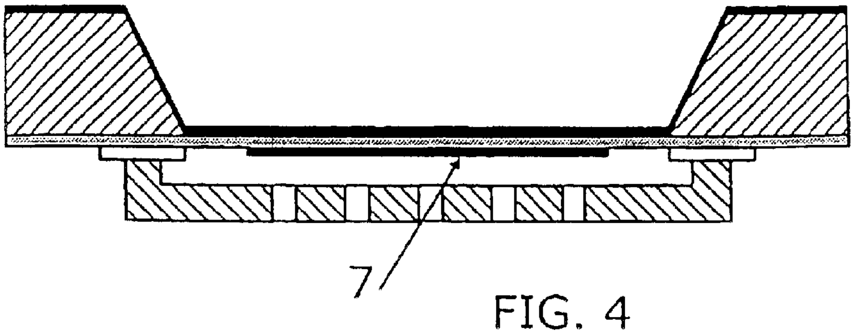
FIG. 4 illustrates yet another microphone chip.
Figure 5:
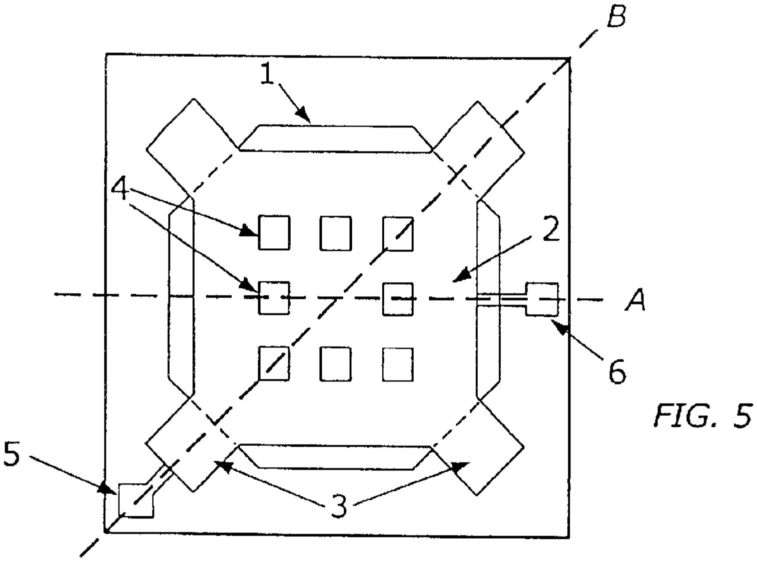
FIG. 5 is a schematic top view of a microphone chip according to this invention.

The top view of the chip that is shown in FIG. 5 shows the perimeter of the diaphragm 1. In this example it is drawn as an octagon, but is can be a square as well, or have any other shape as a result of the used fabrication technique, or the intentions of the designer. The back plate 2 is connected to the chip by four arms or finger-like supports 3. It should be noted that the designer, depending on technological requirements, and desired properties of the microphone, can vary the positioning of the supports and the number of supports. The back plate is provided with holes 4 that are used to control the damping of the diaphragm that is caused by flow of the air as a result of the movements of the diaphragm. In this example there are drawn eight holes, but the designer can choose any number. The number of holes is used for "tuning" the air damping, in other to get the desired frequency response of the microphone. A bond pad 5 provides the electrical contact to back plate. The bond pad 6 provides contact to an optional electrode 7 on the back plate side of the diaphragm in case the microphone design according to FIG. 4 is made.

Figure 6:
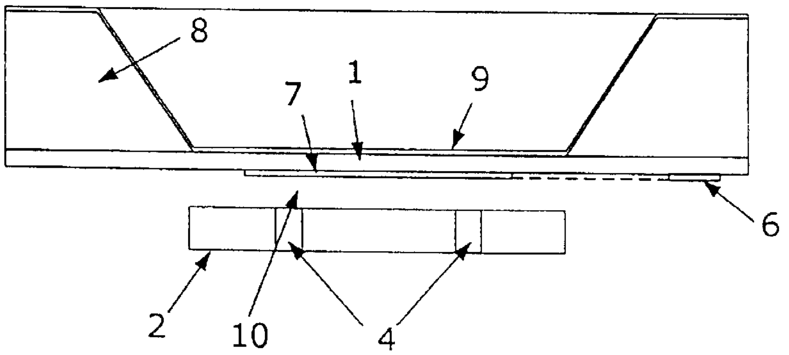
FIG. 6 is a cross-sectional view along line A, as indicated in FIG. 5.

FIG. 6 shows a schematic cross-sectional view of the microphone along line A. The diaphragm 1 is provided with an optional electrode 7 inside the air gap, and with an electrode 9 on the other side of the diaphragm. The second diaphragm electrode 9 provides shielding against electromagnetic interference (EMI), and is at the same potential as the diaphragm electrode 7. The diaphragm is typically made from silicon nitride. The bond pad 6 provides access to the electrode 7. The chip frame 8 supports the diaphragm 1. The back plate 2 is provided with holes 4. The diaphragm electrode 7 and the back plate 2 define an air gap 10 therebetween.

Figure 7:
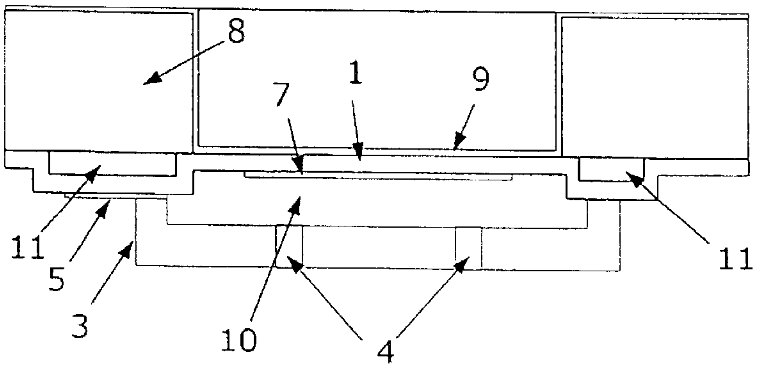
FIG. 7 is a cross-sectional view along line B, as indicated in FIG. 5.

FIG. 7 shows a schematic cross-sectional view of the microphone along line B. Besides the items that are already indicated using the same numbers in FIG. 6, FIG. 7 shows the supports 3 that connect the back plate 2 to the chip with the diaphragm. The electrical connection to the back plate 2 is obtained with bond pad 5. Extra insulators 11 are added to increase the bulk resistance. It should be remembered that back plate 2 and bond pad 5 are at a potential of 100–200 V, whereas electrode 9 and the silicon frame 8 are at ground potential, so there is a voltage drop of 100–200 V across the silicon nitride and the insulator 11. An additional advantage of the insulators 11 is that they decrease the on-chip parasitic capacitance. The parasitic capacitance causes attenuation and increased harmonic distortion of the microphone signal.

In FIGS. 6 and 7, the back plate is shown as a single conductive plate. It will be obvious for those skilled in the art that the back plate can be made in different ways. One method is forming the back plate from a single metal, using thin-film deposition techniques such as evaporation, sputtering, chemical vapor deposition (CVD) or electrochemical deposition in a bath containing a metal salt solution. Another method is fabricating a back plate in another silicon wafer, which is then bonded onto the wafer containing the diaphragms. A third method is fabricating the back plate from a glass wafer, which is provided with an electrode. However, all of these methods can be considered as different embodiments of the same invention.

The described microphone is primarily intended for scientific and industrial acoustic measurements, ie typically the frequency range of 10 Hz to 40 kHz. It will be obvious to those skilled in the art that extending the frequency range to ultrasonic frequencies (>40 kHz) and to infrasonic frequencies (<10 Hz) the invention will have the same advantages.

The MEMS condenser microphone will preferably be mounted in a suitable housing with proper electrical connections and with physical protection, which is known in the art and therefore is not part of the invention.

The MEMS condenser microphone as shown and described can also be used as a capacitive electrical component in general, where its properties as a transducer are of no importance, but where high voltage resistance is a requirement.

What is claimed is:

1. A micromachined capacitive electrical component comprising:

a frame, a plurality of discrete supports, a back plate secured to the frame by the plurality of discrete supports at a plurality of discrete locations and in a fixed relationship to the frame, the back plate having an electrically conductive back plate electrode, a diaphragm of an electrically insulating material secured along its periphery, in a fixed relationship to the frame and at a distance from the back plate, wherein the back plate and the diaphragm define an air gap therebetween, the diaphragm carrying an electrically conductive diaphragm electrode, the frame and the diaphragm electrode being electrically interconnected so as to have substantially the same electrical potential, and a layer of an electrically insulating material disposed between the back plate and the frame through the plurality of discrete supports at least at the discrete locations.

2. A component according to claim 1, wherein the diaphragm is movable in response to sound pressure, wherein the component is an electro-acoustical transducer.

3. A transducer according to claim 2, wherein the distance between the diaphragm electrode and the plate electrode is greater than 10 $\mu$m.

4. A transducer according to claim 2, wherein the layer of an electrically insulating material between the back plate and the frame through the plurality of discrete supports has a thickness so that, when a polarization voltage is applied between the back plate and the diaphragm, the electrical field strength in the layer of an electrically insulating material is less than 50 V/$\mu$m.

5. A transducer according to claim 2, wherein the diaphragm is made from silicon nitride, silicon oxynitride, silicon carbide or from a combination of two or more layers of silicon dioxide, silicon nitride, silicon oxynitride or silicon carbide.

6. A transducer according to claim 2, wherein the diaphragm is provided with an electrode on the side of the diaphragm facing said back plate.

7. A transducer according to claim 2, wherein the back plate is provided with one or more holes.

8. A transducer according to claim 2, wherein the back plate includes monocrystalline silicon or polycrystalline silicon.

9. A transducer according to claim 2, wherein the back plate has one or more metal or metal alloy electrode layers.

10. A transducer according to claim 8, wherein the back plate has a non-conducting layer and one or more metal or metal alloy layers.

11. A transducer according to claim 2, wherein the back plate includes one or more metals or alloys thereof.

12. A transducer according to claim 2, wherein the back plate includes a non-conducting material provided with an electrode comprising one or more metals or metal alloys.

* * * * *